United States Patent [19]

Agrawal

[11] Patent Number: 4,779,229
[45] Date of Patent: Oct. 18, 1988

[54] PROM WITH PROGRAMMABLE OUTPUT STRUCTURES

[75] Inventor: Om P. Agrawal, San Jose, Calif.

[73] Assignee: Advanced Micro Devices, Inc., Sunnyvale, Calif.

[21] Appl. No.: 881,161

[22] Filed: Jul. 2, 1986

[51] Int. Cl.⁴ .............................................. G06F 7/00
[52] U.S. Cl. ...................................... 365/94; 307/465; 340/825.83
[58] Field of Search ................... 365/94, 96, 103, 104; 364/716; 307/465, 468; 340/825.83

[56] References Cited

U.S. PATENT DOCUMENTS

| | | | |
|---|---|---|---|
| 4,422,072 | 12/1983 | Cavlan | 307/465 X |
| 4,546,273 | 10/1985 | Osman | 307/468 |
| 4,609,986 | 9/1986 | Hartmann et al. | 364/716 X |
| 4,617,479 | 10/1986 | Hartmann et al. | 307/465 |
| 4,717,912 | 1/1988 | Harvey et al. | 340/825.83 |

Primary Examiner—Joseph A. Popek
Attorney, Agent, or Firm—Eugene Valet; Warren S. Wolfeld

[57] ABSTRACT

An imporoved, integrated circuit memory device is disclosed. Programmable read only memory (PROM) is combined with a programmable output circuit. The output circuiry can be programmed individually to provide a combinatorial logic signal or a registered logic signal output.

11 Claims, 3 Drawing Sheets

PROM WITH PROGRAMMABLE OUTPUT STRUCTURES

RELATED CO-PENDING PATENT APPLICATION

The present invention is related to pending U.S. patent application Ser. No. 06/433,253, now U.S. Pat. No. 4,717,912, filed Oct. 7, 1982, which is also assigned to the assignee of the present invention. Several claims of said application have been deemed allowable at the time of this filing.

BACKGROUND OF THE INVENTION

1. Field of the Invention

The present invention relates generally to programmable integrated circuit memory devices. More particularly, the present invention relates to a programmable read-only memory (PROM) device having separately programmable output modes.

2. Description of the Related Art

Currently, there are available several types of integrated circuits which provide electronic "memory," i.e., the ability to store digital information. Depending upon the logic function to be implemented, each has certain advantages and disadvantages from the system designers point of view.

One type of integrated circuit in which a fixed set of binary information can be stored is the programmable read-only memory (PROM) device. Basically, the PROM device internally includes a decoder and an addressable array of gates implementing logical functions in a two-level implementation in sum-of-terms form.

For example, the decoder generally comprises a fixed AND gate array by which input variables are decoded and output as the terms of a function. The addressable array comprises OR gates having special internal links that can be fused or severed to form the required circuit paths that "program" the device according to the specifications of the user. In other words, the connections between the outputs of the decoder and the inputs of the OR gates can be specified to implement a certain logic program.

While the use of PROM devices for implementing logic functions has certain advantages over other programmable integrated circuit memory devices (such as speed of operation and ability to decode all input combinations), a major drawback has been that the type of outputs is limited to either combinatorial, as shown in FIG. 1a, or registered, as shown in FIG. 1b, modes only.

FIG. 2a depicts a typical, well-known combinatorial logic-type structure 1. The state of the fuse link 3 will control the gate 5 to invert or not to invert a signal on input 7. The output 9 is commonly known as a "nonstored" or "nonregistered" signal.

FIG. 2b depicts a typical, well-known registered-type structure 11. A data storage register 13 has a data input D coupled via line 7' to one of the input signals, and an output Q coupled via line 9' to one of the single outputs of the circuit or chip. The output as shown in FIG. 1b is commonly known as a "stored" or "registered" signal.

Combinatorial logic output PROM devices are useful when there is a large number of possible input combinations or product term outputs, whereas registered logic output PROM devices are useful for sequential logic, viz., where there is a large number of variables involved in the logic function. For example, a registered PROM device can function as a state machine in which the next output is a function of the present state (stored in the register) and the inputs.

Current generation PROM integrated circuits offer dedicated combinatorial output or registered output structures only. The output structure is fixed and common for all of the output terminals. As a result, system designers must stack each type onto the circuit board to implement each function separately.

Hence, there is a need for a PROM device which provides the capability of defining and programming the architecture of each output on an individual basis.

SUMMARY OF THE INVENTION

It is an object of the present invention to provide a PROM device which can provide either combinatorial or registered output signals.

It is another object of the present invention to provide a PROM device having output components which can be programmed to provide combinatorial or registered output signals, inverted or noninverted, in any combination.

It is yet another object of the present invention to provide a PROM device which has output structures which are individually user programmable.

It is an advantage of the present invention that it can provide both combinatorial and registered signal outputs from one integrated circuit system architecture, i.e., from a single chip.

It is a further advantage of the present invention that utilization of register and pin resources can be maximized by configuring each output to the individual needs of the system designer.

In a broad aspect, the present invention provides a PROM integrated circuit combined with a programmable output structure. The output structure is coupled to the PROM circuit outputs and includes programmable circuitry whereby the user can program the output structure to provide nonstored/nonregistered or stored/registered signals or any combination thereof as the output.

Other objects, features and advantages of the present invention will become apparent upon consideration of the following detailed description and the accompanying drawings, in which like reference designations represent like features throughout the FIGURES.

BRIEF DESCRIPTION OF THE DRAWINGS

FIG. 2a is a schematic drawing of a typical output structure for a PROM integrated circuit as shown in FIG. 1a;

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Reference is made now, in detail, to a specific embodiment of the present invention which illustrates the best mode presently contemplated by the inventor for practicing the invention. Alternative embodiments are also briefly described as applicable.

Figure 1A:
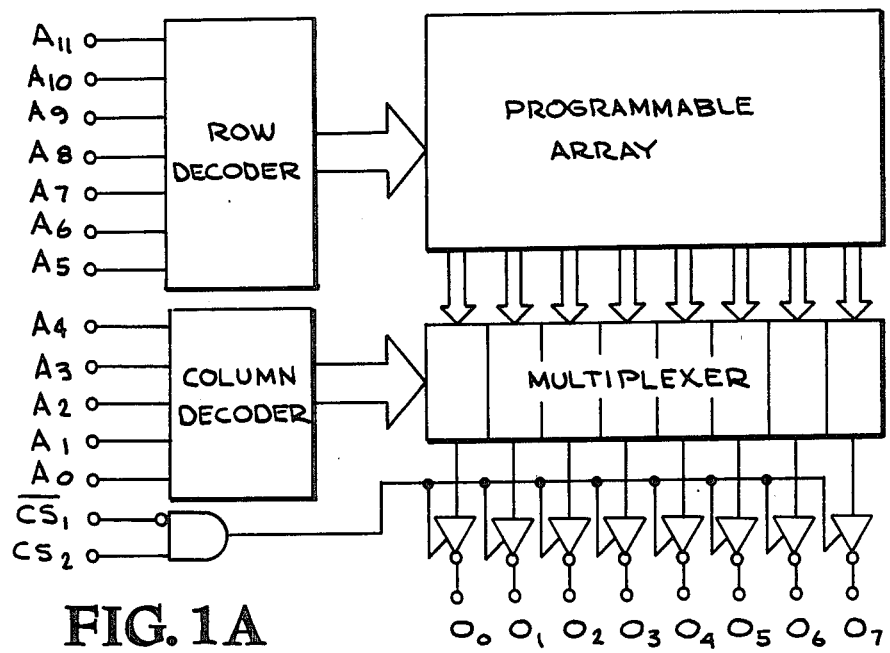
FIG. 1a is a schematic drawing of a typical system architecture of a PROM integrated circuit for implementing nonstored/combinatorial logic functions.
Figure 1B:
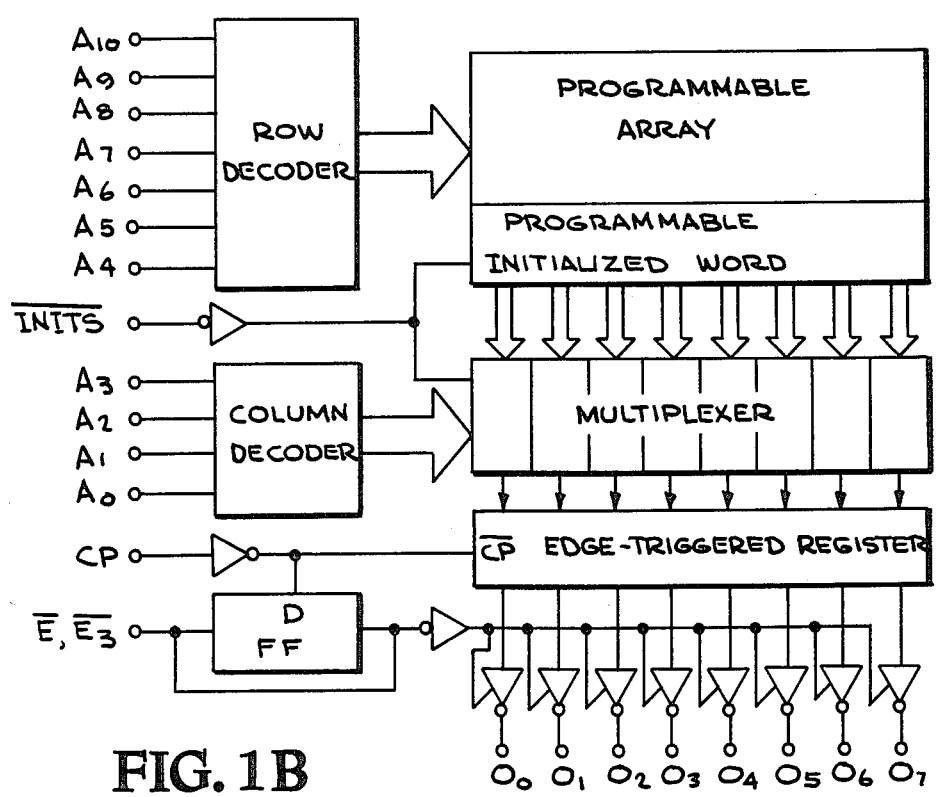
FIG. 1b is a schematic drawing of a typical system architecture of a PROM integrated circuit for implementing stored/registered logic functions.
Figure 2A:
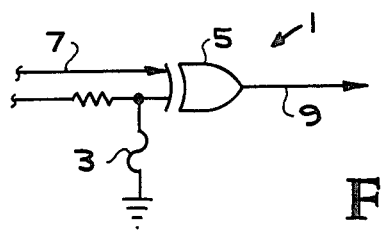
Figure 2B:
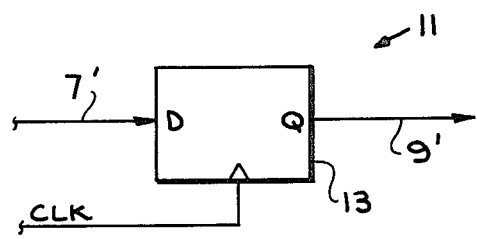
FIG. 2b is a schematic drawing of a typical output structure for a PROM integrated circuit as shown in FIG. 1b.

PROM devices, as depicted in FIGS. 1 and 2, and the implementing specific circuitry, are well-known in the art and are described in detail in many publications. See e.g., *Handbook of Semiconductor and Bubble Memories,* W. A. Triebel and A. E. Chu, Prentice-Hall, Inc., copyright 1982. As such, no detailed discussion is made herein.

Figure 4:
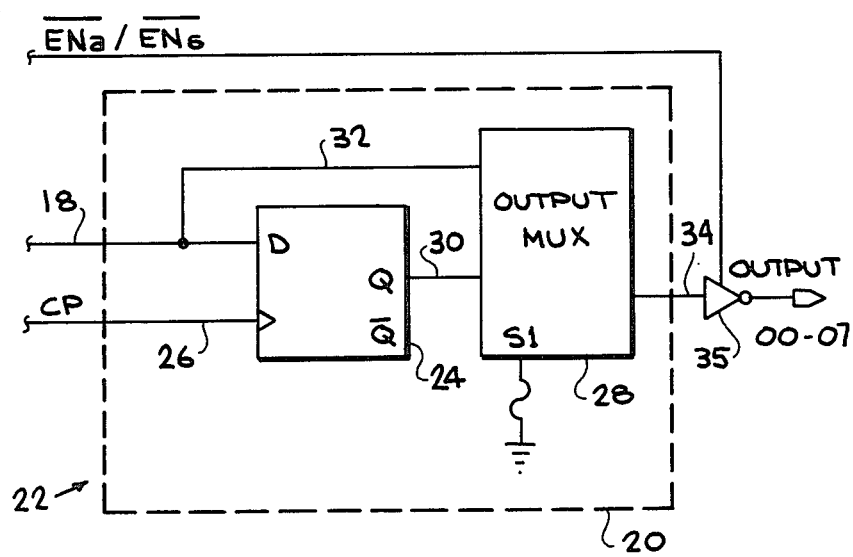
FIG. 4 is a schematic drawing of the output structure of the embodiment of the present invention as shown in FIG. 3.

Embodiments of the output structure used in the present invention, such as shown in FIG. 4, are described in detail in co-pending, partially allowed, U.S. patent application Ser. No. 06/433,253, filed on Oct. 7, 1982, on behalf of the inventors, W. Miller, B. Kitson, and P. Harvey, by the common assignee of the present invention herein. Said application is incorporated by reference herein in its entirety. The embodiments described in said co-pending application are designed to be used in conjunction with programmable array logic (PAL, a registered trademark of Monolithic Memories, Inc.) or programmable logic array (PLA) integrated circuits which implement familiar sum-of-products logic. One such PAL is the AmPAL22V10 described in the Programmable Array Logic Handbook, pp. 2-29 through 2-40, published by Advanced Micro Devices, Inc., Sunnyvale, CA, copyright 1984.

However, programmable array logic and PROM logic differ significantly. Hence, the "output logic macrocell" taught in said co-pending application cannot be simply transferred to other integrated circuit applications. More specifically, the PAL-type implementation must provide for programming output polarity whereas a PROM device by its nature can provide this function. The output logic macrocell structure 20 section of the present invention as shown in FIG. 4 will be described in detail hereinafter.

Figure 3:
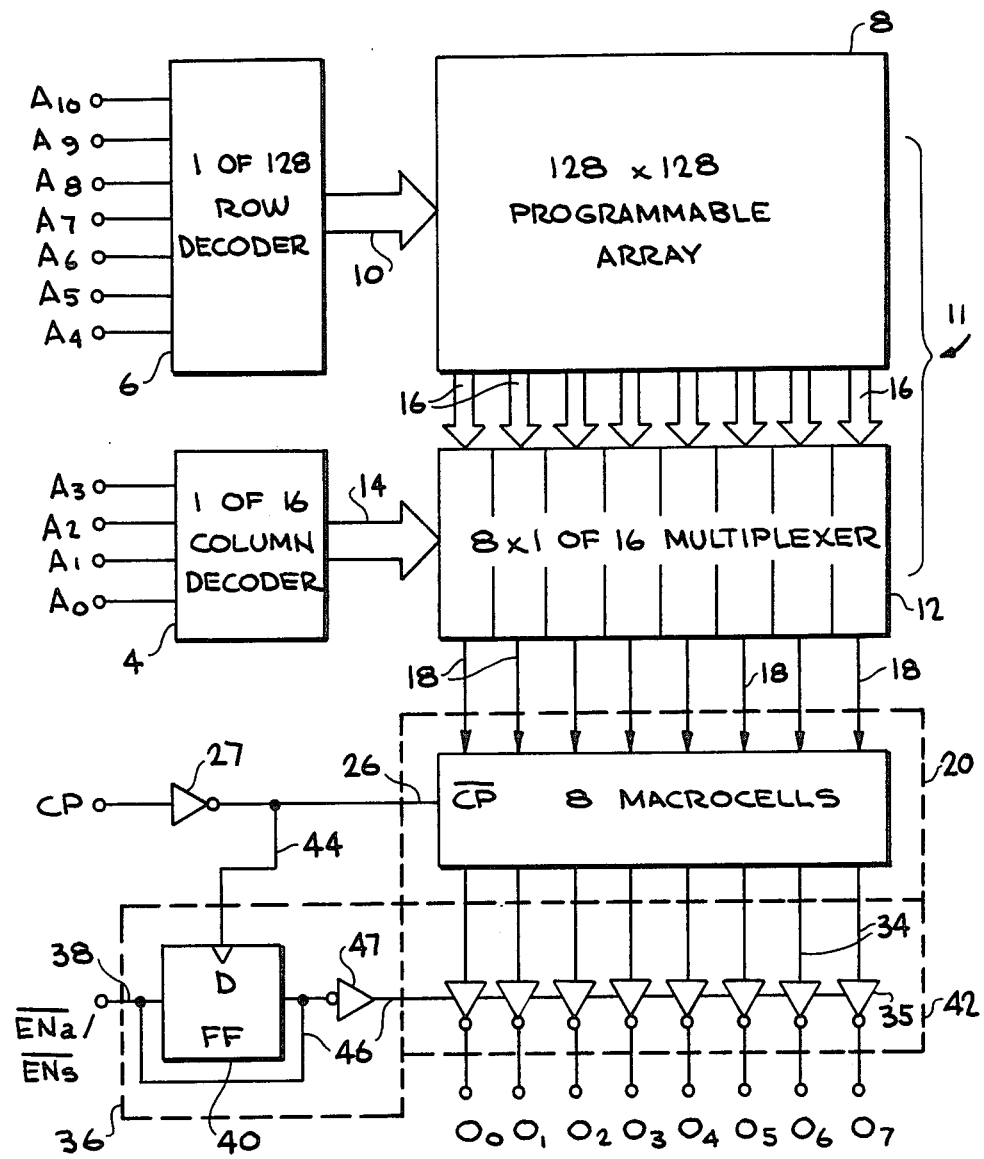
FIG. 3 is a schematic drawing of an exemplary embodiment of the present invention.

Referring now to FIG. 3, the combination of a PROM structure with a programmable output structure is shown. As an exemplary embodiment, a 2048×8 bit PROM device is shown. As will be readily apparent to a person skilled in the art, the present invention can be implemented in a multitude of memory size configurations and input/output pin chip carrier packages. Therefore, the specific architecture described herein is not to be understood as any specific limitation on the invention, but only as an example of one embodiment of the general inventive concept.

The PROM section 2 of the exemplary embodiment of the present invention has eleven input lines, A0-A10. A0-A3 are input to sixteen array column decoder circuit components 4. Inputs A4-A10 are coupled to one hundred twenty-eight array row decoder circuit components 6.

The memory is, for example, a programmable AND array 8 arranged in a 128×128 matrix used to store digital data.

Depending on the binary code address bits applied to the input lines A4-A10, each row decoder 6 provides a signal to select one of the rows in the array 8 via input lines 10. Each row decoder 6 thus enables a row to be READ.

The remaining address input bits A0-A3, are decoded by the column decoders 4. The column decoders 4 are used to provide signals to a multiplexer 12 via input lines 14. The exemplary multiplexer 12 has eight units, each having sixteen input terminals coupled to lines 16. Each of the eight multiplexer units has an output terminal for transmitting via output lines 18 the selected one of the sixteen inputs. Each column decoder 4 thus enables a multiplexer 12 to transmit an eight bit word out of the array 8 via lines 16. Thus, the data words are available for input to the programmable output logic structure 20 via multiplexer output lines 18.

The output logic structure 20 provides eight output cells 22, also referred to as "macrocells," as shown in FIG. 4. A D-type registered flip-flop 24 is coupled to multiplexer output lines 18 to receive the PROM section 2 output on its D-input terminal. The flip-flop 24 is also adapted to receive clock signals via input line 26. The Q-output of the flip-flop 24 is coupled to a first input of an output logic multiplexer 28 via line 30. A second input terminal of each output logic multiplexer 28 is coupled directly to a PROM section output line 18 via input line 32.

In this embodiment, each output multiplexer 28 of the macrocell 22 includes a programmable fuse link S1. By severing or not severing fuse link S1, each macrocell 22 can be programmed to select between the signals on its two input lines 30, 32 for transmitting to the device output via output line 34 through inverter 35 to a chip output pin 00-07. In other words, the user can program the macrocell to select for an output to output pins 00-07 between a registered signal via its first input or a nonregistered, viz., combinatorial logic, signal via its second input 32.

In this embodiment, the macrocells 20 are fuse programmable. Therefore, once programmed, the output of each macrocell 20 becomes fixed to serve as a combinatorial or registered output. This, however, should not be construed as a limitation on the structure of the invention.

Alternatively, though more complicated and, hence, requiring more chip space, the macrocell 20 could be digitized by replacing the fuse controlled output multiplexer 28 with a signal controlled pass-gate circuitry. Thus, by programming the control signal, the macrocell 20 could be alternatively used to operate in either the combinatorial or registered output mode at any specific time dependent on the control signal to the passgate circuitry. This can offer an ultraviolet radiation erasable PROM or electrically erasable PROM configuration capability. As will be recognized by a person skilled in the art, therefore, the fuses can be replaced by other programmable logic circuit elements to create alternative embodiments which are within the scope of the present invention.

Referring back to FIG. 3, the present invention can alternatively be adapted to provide for either asynchronous (i.e., immediate signal transmission) or synchronous (i.e., clocked signal transmission) operation. An output enable circuit 36 has an input line 38 coupled to a device input pin for receiving an output enable signal, $\overline{ENa}$ or $\overline{ENs}$. The enable signal is provided as an input to a D-type flip-flop 40. The enable signal is also sent directly to a device output buffer 42 via flip-flop bypass line 46 through inverter 47.

A clock pulse for the synchronous mode of operation is provided on a device input pin which is coupled to the macrocells' flip-flop 24 via line 26 through, in this embodiment, inverter 27, as shown in FIG. 4, and to the output enable flip-flop 40 via line 44. For asynchronous operation, $\overline{ENa}$ is sent directly to the output buffer via line 46.

Referring to FIGS. 3 and 4, it can be appreciated that the user can program the memory section 2 to contain digital data essential to the operational parameters of the system for which the device is used. Moreover, by severing or not severing the fuses S1 of individual cells of the output structure 20, the user is provided the capability of defining and programming the output sent through the output buffer 42 to be registered, combinatorial or a combination of the two. The output enable circuitry 36 permits the user to choose between synchronous and asynchronous timing.

This combination allows the designer to optimize the device design and usage, e.g., by using only as many registers as needed. An advantage for the system designer is that only the device of the present invention, rather than separate combinatorial and registered devices, is needed for systems which require both types of logical operation.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in any technology, such as with MOS or biMOS or bipolar processes. The embodiment was chosen and described in order to best explain the principles of the invention and its practical application to thereby enable others skilled in the art to understand the invention for various embodiments and with various modifications as are suited to the particular use contemplated. It is intended that the scope of the invention be defined by the claims appended hereto and their equivalents.

What is claimed is:

1. An improved integrated circuit memory device, having input terminals and output terminals, characterized by the combination of:
 a programmable read only memory (PROM), having inputs coupled to said input terminals, and further having outputs; and
 programmable output means, coupled to each output of said programmable read only memory, individually programmable for either (1) providing to a corresponding one of said output terminals the signal on said output of said PROM, or (2) storing the signal on one of said outputs of said PROM to generate a stored signal and providing said stored signal to said corresponding one of said output terminals.

2. An improved integrated circuit memory device, having a plurality of input terminals and a plurality of output terminals, characterized by the combination in a single integrated circuit chip of:
 programmable read only memory means for storing data in a binary form, having input circuit means coupled to said input terminals for receiving signals for accessing said data and having output circuit means for transmitting stored data accessed in response to said signals; and
 programmable output means, coupled discretely to said memory means output means, adapted to be individually programmed for providing a stored signal or nonstored signal, respectively, to said output terminals, whereby said output terminals can individually serve combinatorial or registered output functions,
 said programmable output means further including
 (a) storage means for holding said transmitted stored data as said stored signal; and
 (b) selector means, having a first input coupled to said output circuit means and a second input coupled to said storage means, for selecting between a nonstored signal from said output circuit means and said stored signal held in said storage means.

3. The device as set forth in claim 2, further characterized in that:
 said selector means further comprises a fuse programmable multiplexer circuit device.

4. The device as set forth in claim 2, further characterized in that:
 said selector means further comprises a programmable logic circuit.

5. An improved programmable integrated circuit memory chip, having input pins and output pins, characterized by the combination of:
 a programmable read only memory (PROM) device coupled to said input pins, having a plurality of outputs; and
 a like plurality of programmable chip output circuit means, each said output circuit means having an input coupled to one of said PROM outputs, for transmitting a first signal or a second signal to said output pins, such that said first signal represents a registered logic signal output and said second signal represents a combinatorial logic signal output,
 said output circuit means further including
 (a) register means for storing said first signal, having a first input coupled to one of said PROM outputs and an output for transmitting said first signal; and
 (b) output selector means, having a first input coupled to said same one of said PROM outputs and a second input coupled to said register means output, for selecting between said first and second signals, and an output for transmitting the selected first or second signal.

6. The memory chip as set forth in claim 5, further characterized in that:
 said output selector means further has a select input coupled to one of said input pins for receiving a signal for selecting between synchronous and asynchronous output modes.

7. The memory chip as set forth in claim 5, further characterized in that:
 said output selector means further comprises a fuse programmable multiplexer wherein the state of said fuse determines whether said multiplexer selects said first signal or said second signal.

8. The memory chip as set forth in claim 5, further characterized in that:
 said output selector means further comprises a programmable logic circuitry.

9. The memory chip as set forth in claim 8, further characterized in that:

said programmable logic circuitry comprises passgate circuitry.

10. The memory chip as set forth in claim 5, wherein said output selector means further comprises:

means for selecting between said first signal, said second signal, a third signal being the inverse of said first signal and a fourth signal being the inverse of said second signal; and programmable means for controlling said output selector means to provide at said output of said output selector means said first signal or said second signal or said third signal or said fourth signal.

11. A circuit package, comprising:

(a) a PROM circuit for producing a plurality of data signals;

(b) a plurality of pins; and (c) a plurality of output structures coupled between said PROM circuit and said plurality of pins, respectively, each of said output structures including (i) an input coupled to said PROM circuit and receiving one of the data signals;

(ii) an output coupled to one of said pins;

(iii) means, responsive to the data signal on said input, for providing a stored non-inverted first signal and a non-stored non-inverted second signal and an inverted third signal of said first signal and an inverted fourth signal of said second signal; and (iv) means for selecting said first signal or said second signal or said third signal or said fourth signal as an output signal on said output, wherein said means for providing comprises:

(a) a register for storing and outputting said first signal;

(b) a conductor for conducting said second signal;

(c) a first inverter for inverting said first signal to provide said third signal; and (d) a second inverter for inverting said second signal to provide said fourth signal.

* * * * *